Feb. 28, 1950 N. I. KORMAN 2,498,759

WIDE BAND OSCILLATOR AND MODULATOR

Filed March 24, 1947

INVENTOR.

Nathaniel I. Korman

BY H. S. Grover

ATTORNEY

Patented Feb. 28, 1950 2,498,759

UNITED STATES PATENT OFFICE 2,498,759

WIDE BAND OSCILLATOR AND MODULATOR

Nathaniel I. Korman, Camden, N. J., assignor to Radio Corporation of America, a corporation of Delaware Application March 24, 1947, Serial No. 736,693

12 Claims. (Cl. 332—22)

This application relates to oscillation generators which may be varied in frequency continuously through a wide range by control potentials or by signals.

The main object of my invention is to provide an oscillation generator capable of being varied or modulated over a wide range of frequencies without band switching.

It is possible to get such a wide range with a beat frequency oscillator, but drift of either of the primary frequencies causes a serious drift in the beat frequency. For example, if a 100 kc. oscillator beats against a 110 kc. oscillator to get a 10 kc. beat note, a very small drift in frequency of either of the oscillators will result in a large percentage frequency change in the beat note.

A more detailed object of my invention is to provide an audio frequency oscillator whose frequency may be changed electronically through a wide range of frequencies.

Heretofore, oscillators of this type have used mechanical tuning or frequency shifting devices. In my oscillator, the control is entirely electronic and where desired is sufficiently fast to operate in accordance with modulation potentials.

Oscillators of the type discussed above and described in detail hereinafter are of wide use in the radio and allied arts. Such oscillators are used for test purposes and for developing sweep frequency oscillations for use in television and similar systems. Oscillators of this type are of particular value in such fields but may also be used in higher frequency applications.

The above objects are attained in accordance with my invention as follows:

Two phase shifter stages are connected in a ring circuit, the phase shifter stages being separated by decoupling or isolating stages, one of which acts also to reverse phase. At the frequency of oscillation, in each phase shifter stage, there is a 90° phase shift and in one of the decoupling stages, a 180° phase shift or phase reversal takes place. Thus, in the ring circuit, a 360° phase shift takes place, this being the condition required for sustained oscillation generation.

The frequency at which the 90° phase shift is maintained in each stage, may be varied by varying the phase shifting characteristic of the stage so that the ring circuit must operate at a different frequency to re-establish a 90° phase shift in each stage. Where the phase shifters are tubes, the frequency may be varied by varying the transconductance thereof. This is done by varying the grid bias. Since the speed at which the bias may be changed is very high, my improved oscillator may be controlled by a slow or rapidly varying control potential. Thus, it may be used to develop oscillations, the frequency of which may be adjusted through a wide range or for angle modulation purposes.

Although it is believed that my invention will be clearly understood by those skilled in the art from the brief description given above, I will now describe the same in detail and in doing so, reference will be made to the drawings wherein.

In U. S. Patent 2,143,386, it is shown that the network of Fig. 1 has the property of shifting the phase of the translated voltages between the input and output without changing their relative amplitudes. The equation of operation is:

$$\frac{e2}{e1}=\frac{1-Zg}{1+Zg}=\frac{1-jxg}{1+jxg}=-2\tan^{-1}xg \quad \text{(Equation \#1)}$$

where $e1$ is the input voltage, $e2$ is the output voltage, $Z=jx$ is a pure reactance and $g$ is the transconductance of the tube. As set forth in said patent, where $Zg$ is purely imaginary, $e2$ is of about the same magnitude as $e1$. Moreover, there is a phase shift of the translated voltage $e2$ which is twice the angle whose tangent is the absolute value of $Zg$. Thus if $g$ is varied from zero to infinity, the phase of $e2$ may be varied from an in-phase to an opposed phase relation with respect to $e1$. $g$ may be varied by varying the bias applied to the grid of the tube T2 of Fig. 1.

Figure 1:
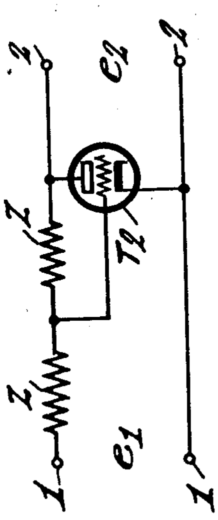
Fig. 1 illustrates a known phase shifter such as used in my system.

The output terminals 2—2 of Fig. 1 preferably feed into a high impedance load. The input terminals 1—1 of the translating network of Fig. 1 preferably feed out of a low impedance source.

Figure 2:
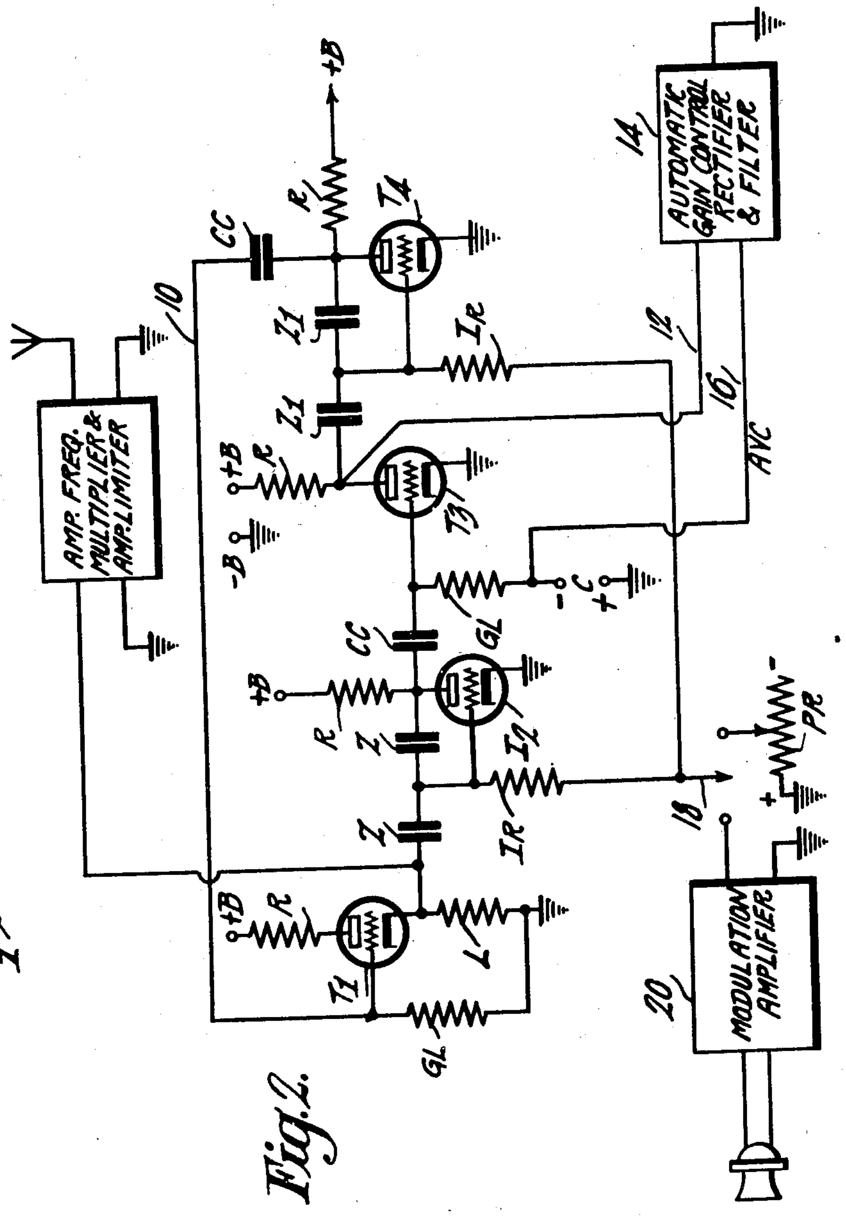
Fig. 2 illustrates the essential features of a wide band oscillator arranged in accordance with my invention and modulating means therefor.

The circuit of Fig. 2 includes the essential features of a wide band oscillator and modulator arranged in accordance with my invention. In Fig. 2, T2 and T4 are the phase shifter tubes. The tube T2 has its electrodes connected as illustrated in Fig. 1. The tube T4 has its electrodes substantially similarly connected. The impedances Z of Fig. 1 appear as capacitive reactances Z connected with the electrodes of tube T2 and as similar capacitive reactances Z1 connected with the electrodes of the tube T4. The tubes T1 and T3 are the amplifier and/or decoupling stages. T1 has its cathode connected to ground by an output resistor L and its grid connected to ground by a grid leak resistor GL. The grid of tube T1 is also coupled to the anode of tube T4 by coupling condenser CC. The tube T1 acts as a cathode follower stage with the cathode end of its cathode follower load L serving as the input to the first phase shifter tube network Z—Z. This cathode follower stage is the low impedance input source for the phase shifter 12. The anode of the phase shifter 12 is coupled by a coupling and blocking condenser CC to the grid of the coupling stage tube T3, and this input circuit may be made to be a high impedance into which the output of 12 feeds. The anode impedance of the tube T3 feeds into the network Z1, Z1 of the phase shifting tube T4 and may be made of low impedance. The ring circuit is completed by the lead 10 and the blocking condenser CC connected to the anode of the tube T4 whose output couples into the high impedance input of tube T1.

The anodes of all of the tubes are connected to the positive terminal of a direct current source by anode resistors R. The grids of tubes 12 and T4, that is, the grids of the phase shifting tubes are connected together by the isolating resistors IR and then connected to the negative terminal of a source of control or modulating potential, the positive terminal of which is grounded.

The circuit of Fig. 2 will oscillate at the frequency at which the phase shift in each of the phase shift circuits is 90°. Referring to Equation #1, the frequency of oscillation is given by $xg=1$ (Equation #2) or, since $$X=\frac{1}{wc},\ w=\frac{g}{c}$$

If the bias is varied on the phase shifter tubes 12 and T4, it is apparent that the frequency will vary directly with the transconductance of the phase shifter tubes. Since the transconductance can be varied from zero to some finite value, the frequency theoretically may be varied from zero to some finite value determined by the size of C and the maximum value of $g$. Practically, however, a low limit is set to the frequency by various parts of the circuit of Fig. 2 such as the grid leaks GL, the blocking capacitors CC and so forth. It is believed that a frequency range of at least 10 to 1 and possibly as large as 100 to 1 may be obtained in this oscillator.

For sustained oscillations in the ring circuit, the overall gain must be unity or more. In order to obtain a good wave shape, the gain should not exceed unity by too great a factor. To insure such operation, I provide an automatic gain control circuit. Such automatic gain control circuits are commonly known in the art. Preferably, energy is diverted from the output of the coupling tube T3 by lead 12 and supplied to an automatic gain control rectifier and filter circuit in the unit 14 to supply an automatic gain control voltage which may be fed over lead 16 and resistor GL to the control grid of tube T3 to control the gain of this stage and thereby control the total gain in the ring circuit.

The output may be taken from the cathode of T3, or by a coupling to the anode of this same tube T3, and supplied to amplifiers and frequency multipliers for use as desired. These stages may include current amplitude limiters if desired.

The control potentials may be supplied to the grids of both tubes 12 and T4 by lead 18 and may be taken from a modulation amplifier 20 in which case, the varied oscillations will be frequency modulated in accordance with the signals or the oscillator may be used to generate any selected one of a wide range of frequencies by connecting the lead 18 to a point on the potentiometer resistor PR for adjusting the bias on the grids of the tubes 12 and T4 manually as desired.

What is claimed is:

1. In an oscillation generator, a plurality of alternating voltage amplifiers and phase shifters in a ring circuit, the phase shifters operating together to impart to alternating voltages of a selected frequency set up in said ring circuit, a phase shift of substantially 360°, automatic gain control means for an amplifier of said ring circuit, said means being responsive to voltages generated in said ring circuit to maintain a gain of unity or more therein, and means for varying the phase shift produced by said phase shifters to vary the frequency of the alternating voltage at which the said 360° phase shift is established.

2. In an oscillation generator, a plurality of alternating voltage amplifiers coupled by electronically controlled phase shifters in a ring circuit, the phase shifters operating together to impart to alternating voltages of a selected frequency set up in said ring circuit, a total phase shift of substantially 360°, or a whole multiple thereof, automatic gain control means for an amplifier of said ring circuit, said means being responsive to voltages generated in said ring circuit to maintain a gain of unity or more therein, and electronic means for varying the phase shift produced by said phase shifters to vary the frequency of the alternating voltage at which the said total phase shift is established.

3. In an oscillation generator, an alternating current phase shifter arrangement and an alternating current phase reverser in a ring circuit including amplifying means to insure a gain of unity or more, the phase shifter arrangement and phase reverser operating to impart to alternating current of a selected frequency set up in said ring circuit, a total phase shift of substantially 360°, or an integral multiple thereof, means for varying the phase shift produced by the phase shifter arrangement to vary the frequency of the alternating voltage at which the said total phase shift is established, and automatic gain control means for said amplifying means responsive to generated voltages for maintaining the gain of said ring circuit at unity or more.

4. In an oscillation generator, two electron discharge tube phase shifters and a tube phase reverser connected in cascade in a ring circuit having an overall amplification gain of at least one, the extent of phase shift in the phase shifters being such that the total phase shift in the ring circuit is 360°, or a whole multiple thereof, at a selected frequency, an output circuit coupled to said ring circuit, and means for varying the transconductance of the phase shifter tubes to vary the frequency at which said total phase shift is established.

5. In an oscillation generator, two electron discharge tube phase shifters and a tube phase reverser connected in cascade in a ring circuit, the phase shifters being such that phase shift without amplitude variation is accomplished, the extent of phase shift in the phase shifters being such that the total phase shift in the ring circuit is 360°, or an integral multiple thereof, at a selected frequency, and means for varying the transconductance of the phase shifter tubes to vary the frequency at which said total phase shift is established.

6. In an oscillation generator, two electron discharge tube phase shifters and a phase reversing amplifier tube connected in cascade in a ring circuit, the amplifier being adapted to provide a gain of at least one in the ring circuit, the extent of phase shift in the phase shifters being such that the total phase shift in the ring circuit is 360° at a selected frequency, an output circuit coupled to said ring circuit, means for varying the transconductance of the phase shifter tubes to vary the frequency at which said 360° phase shift is established, and means excited by the oscillations generated for controlling the gain in said ring circuit inversely in accordance with the amplitude of the oscillations generated.

7. In an oscillation generator, an electron discharge tube phase shifter, a phase reversing tube amplifier, a second electron discharge tube phase shifter and a coupling stage tube connected in the order given in a ring circuit, the amplifier being adapted to provide a gain of at least one in the ring circuit, the extent of phase shift in the phase shifters being such that the total phase shift in the ring circuit is 360° or a multiple thereof at a selected frequency, an output circuit coupled to said ring circuit, means for varying the transconductance of the phase shifter tubes to vary the frequency at which said total phase shift is established, and means excited by the oscillations generated for controlling the gain in said ring circuit inversely in accordance with the amplitude of the oscillations generated.

8. In a modulation system, an oscillation generator comprising two electron discharge tube phase shifters and a tube phase reverser and amplifier between said tube phase shifters coupling the same in cascade, said tube phase shifters each having an input and an output, said tube phase reverser having a high impedance input into which the output of one tube phase shifter feeds and a low impedance output from which the input of the other phase shifter tube is fed, a coupling between the output of said other phase shifter and the input of said one tube phase shifter to form a ring circuit wherein the extent of phase shift provided in the tube phase shifters is such that the total phase shift in the ring circuit is 360° at a selected frequency, said ring circuit having an overall amplification of at least one, an output circuit coupled to said ring circuit, and a source of variable energy coupled to at least one phase shifter tube for varying the transconductance of said phase shifter tube to vary the frequency at which said 360° phase shift is established.

9. A modulation system as recited in claim 8 wherein a tube is included in said first-mentioned coupling and wherein said last named tube has a high impedance input coupled to the output of said other phase shifter and a low impedance output coupled to the input of said one phase shifter.

10. A system as recited in claim 8 wherein said source of variable energy represents signals and is coupled cophasally to both phase shifter tubes.

11. In a modulation system, an oscillation generator comprising two electron discharge tube phase shifters and a tube phase reverser and amplifier between said tube phase shifters coupling the same in cascade, said tube phase shifters each having an input and an output, said tube phase reverser having a high impedance input into which the output of one tube phase shifter feeds and a low impedance output from which the input of the other phase shifter tube is fed, a coupling between the output of said other phase shifter and the input of said one tube phase shifter to form a ring circuit wherein the extent of phase shift provided in the tube phase shifters is such that the total phase shift in the ring circuit is 360° at a selected frequency, said ring circuit having an overall amplification of at least one, an output circuit coupled to said ring circuit, a source of variable energy coupled to a phase shifter tube for varying the transconductance of said phase shifter tube to vary the frequency at which said 360° phase shift is established, a rectifier coupled to said ring circuit to derive oscillatory energy therefrom and provide a rectified component representative of the magnitude of the oscillatory energy, and connections for suppling said rectified component as biasing potential to the input of said tube phase reverser and amplifier.

12. A system as recited in claim 11 wherein a cathode follower tube is included in said first-mentioned coupling, said tube having a control grid coupled to the output of said other phase shifter and having a cathode coupled to the input of said one phase shifter.

NATHANIEL I. KORMAN.

REFERENCES CITED

The following references are of record in the file of this patent:

UNITED STATES PATENTS

| Number | Name | Date |
|---|---|---|
| 2,143,386 | Roberts | Jan. 10, 1939 |
| 2,165,517 | Stevenson | July 11, 1939 |
| 2,312,977 | Percival | Mar. 2, 1943 |
| 2,373,437 | Vanderlyn et al. | Apr. 10, 1945 |

FOREIGN PATENTS

| Number | Country | Date |
|---|---|---|
| 395,596 | Great Britain | July 20, 1933 |